United States Patent [19]

McIntyre et al.

[11] Patent Number: 4,458,260
[45] Date of Patent: Jul. 3, 1984

[54] AVALANCHE PHOTODIODE ARRAY

[75] Inventors: Robert J. McIntyre, Pointe-Claire; Paul P. Webb, Beaconsfield, both of Canada

[73] Assignee: RCA Inc., Ste. Anne-de-Bellevue, Canada

[21] Appl. No.: 323,200

[22] Filed: Nov. 20, 1981

[30] Foreign Application Priority Data

Oct. 6, 1981 [CA] Canada ................................. 387431

[51] Int. Cl.³ ..................... H01L 27/14; H01L 31/00; H01L 29/90
[52] U.S. Cl. ........................................ 357/30; 357/13; 357/90; 357/52; 357/20
[58] Field of Search ................... 357/30 A, 52 D, 13, 357/52, 30, 20, 90

[56] References Cited

U.S. PATENT DOCUMENTS

| | | | |
|---|---|---|---|
| 3,601,668 | 8/1971 | Slaten et al. | 357/30 |
| 3,608,189 | 9/1971 | Gray | 29/571 |
| 3,703,669 | 11/1972 | London | 317/235 |
| 4,021,844 | 5/1977 | Gilles et al. | 357/31 |
| 4,129,878 | 12/1978 | Webb . | |
| 4,232,328 | 11/1980 | Hartman et al. | 357/13 X |

Primary Examiner—Andrew J. James
Assistant Examiner—W. Mintel
Attorney, Agent, or Firm—Birgit E. Morris; Donald S. Cohen; William J. Burke

[57] ABSTRACT

The invention is an APD array having a plurality of p-n junctions. The p-n junctions comprise a plurality of separate regions which extend a distance into a semiconductor body from a surface thereof and have a conductivity type opposed to that of the body. A region of the same conductivity type as that of the body extends a further distance into the body and is composed of sub-regions which overlap one another in the direction parallel to the surface of the body. The elements so formed have a more uniform avalanche gain and, because of the overlap of the sub-regions of first conductivity type, the likelihood of electric breakdown at the surface is reduced and the electrical isolation between the elements is increased. Moreover, because of the proximity of the adjacent elements the likelihood of breakdown at the junction edges is reduced.

9 Claims, 1 Drawing Figure

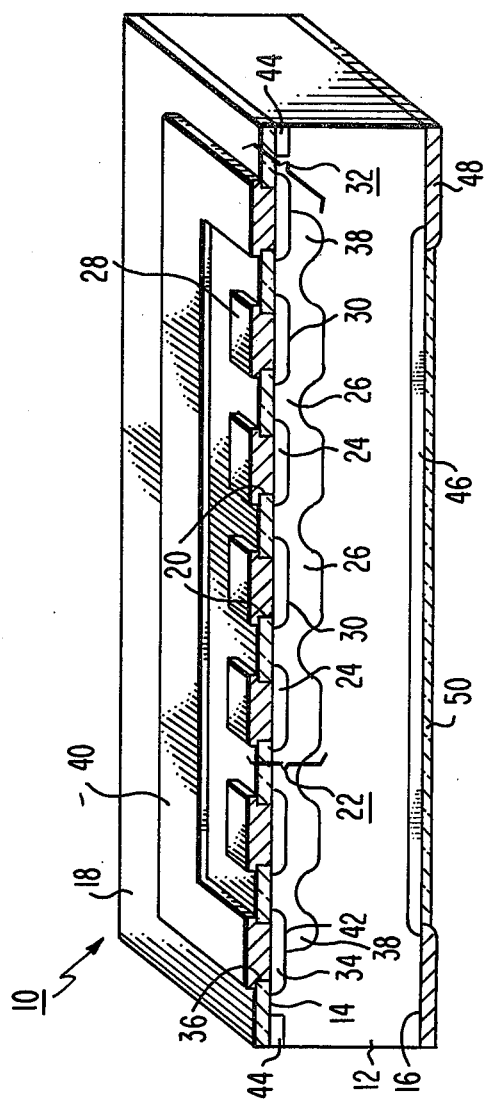

AVALANCHE PHOTODIODE ARRAY

The invention relates to an avalanche photodiode (APD) array and in particular to an array where the elements of the array are closely spaced.

BACKGROUND OF THE INVENTION

An APD is typically composed of a body of $\pi$-type conductivity semiconductor material having a region of n-type conductivity extending a distance into the body from a surface thereof with a p-type conductivity region extending a further distance into the body from the n-type region, creating a p-n junction therebetween. A $p^+$-type conductivity contacting region extends a distance into the body from an opposite surface thereof. Electrical contact is made to the contacting region and the n-type region. In the operation of this APD, an applied reverse bias voltage produces an electric field within the APD whose profile depends upon the impurity concentration in the different regions and which forms a depletion region reaching into the $\pi$-type region. Light incident on the surface containing the contacting region enters the photodiode and is absorbed primarily in the $\pi$- or p-type regions, generating electron-hole pairs. The electrons are accelerated by the electric field until they attain sufficient energy for multiplication.

Webb, in U.S. Pat. No. 4,129,878, has disclosed an APD array in which the contacting region is segmented into a plurality of regions, each having a separate electrical contact. Such a device has the disadvantages that the electrical isolation between adjacent elements is poor and that a portion of the light entering the device will be masked by the electrical contacts to the individual elements. Segmentation on the p-n junction side of the device has not been satisfactory for several reasons. In an avalanche p-n junction the diameter of the n-type region is greater than that of the p-type region to prevent edge breakdown, thereby increasing the dead space between elements of an array. A large spacing is also required between the elements to prevent voltage breakdown between the elements. It would be desirable to have an APD array which has a plurality of closely spaced p-n junctions with good electrical isolation between the individual elements, a reasonably uniform gain and minimized dead space between the elements.

SUMMARY OF THE INVENTION

The invention is an APD array which includes a semiconductor body of a first conductivity type, a plurality of separate regions of a second conductivity type extending a distance into the body from a surface thereof, and a region of first conductivity type containing an uncompensated excess concentration of a first type conductivity modifier, said region comprising sub-regions extending a further distance into the body from the regions of second conductivity type with neighboring sub-regions overlapping one another, thereby forming a plurality of p-n junctions with the regions of second conductivity type. The excess concentration of the first type conductivity modifier decreases with increasing distance from the p-n junctions thereby producing an almost uniform electric field along the p-n junctions of the individual elements, reducing the likelihood of electrical breakdown at the surface and, in the presence of a bias voltage, producing a high degree of electrical isolation.

BRIEF DESCRIPTION OF THE DRAWING

The FIGURE is a sectioned perspective view of the APD array of the invention.

DETAILED DESCRIPTION OF THE INVENTION

Referring to the FIGURE, an APD array 10 includes a body 12 of $\pi$-type semiconductor material having opposed major surfaces 14 and 16. A passivation layer 18 having a plurality of openings 20 therethrough overlies the major surface 14. The elements 22 of the array are composed of n-type regions 24, a p-type region 26 and electrical contacts 28 to the n-type regions 24. P-n junctions 30 of the elements 22 are formed at the interfaces of the n-type regions 24 and the p-type region 26. The n-type regions 24 extend along the surface 14 towards but do not contact one another. The p-type region 26, which contains a non-uniform excess uncompensated concentration of acceptors, extends a further distance into the body 12 from the n-type regions 24. A guard ring 32 extends about the periphery of the array and includes an n-type guard ring region 34 extending a distance into the body 12 from the surface 14 in the region of a guard ring opening 36 in the passivation layer 18, a p-type guard ring region 38 and a guard ring electrical contact 40. The p-type guard ring region 38, containing an excess uncompensated concentration of acceptors, extends a further distance into the body 12 from a portion of the n-type guard ring region 34 and overlaps the p-type region 26 on at least a portion of the periphery of the array. The guard ring electrical contact 40 overlies the n-type guard ring region 34 in the guard ring opening 36. A guard ring p-n junction 42 is thus formed at the interface between the n- and p-type guard ring regions 34 and 38 respectively. A channel stop 44, containing an excess concentration of acceptors, extends a distance into the body 12 and about the periphery of but does not contact the guard ring 32. A $p^+$-type contacting region 46, containing an excess concentration of acceptors, extends a distance into the body 12 from the surface 16. An electrical contact 48 overlies a portion of the surface 16 to make electrical contact to the contacting region 46. An anti-reflection coating 50 overlies the remainder of the surface 16.

The body 12 is typically composed of high resistivity Si having $\pi$-type conductivity and a resistivity between about 3000 and about 10,000 ohm-cm ($\Omega$-cm).

The passivation layer 18 is about 0.6 micrometer ($\mu$m) thick and is preferably composed of about 0.5 $\mu$m of $SiO_2$ and about 0.1 $\mu$m of $Si_3N_4$ deposited using techniques well known in the art. The openings 20 and the guard ring opening 36 are formed using standard photolithographic and chemical etching techniques.

The n-type regions 24 and the n-type guard ring region 34 preferably contain phosphorus. The p-type region 26 and the p-type guard ring region 38 preferably contain an excess concentration of boron. The n- and p-type guard ring regions 34 and 38 are preferably formed at the same time as the n-type regions 24 and the p-type region 26 and have approximately the same concentration of conductivity modifiers and extend the same distances into the body. The p-type guard ring region 38 preferably extends into the body only from that portion of the n-type guard ring region 34 closest to the elements 22.

The n-type regions 24 and the p-type region 26 and the n- and p-type guard ring regions 34 and 38 are formed sequentially using a masking oxide which patterns the n-type regions of the elements and guard ring and a photoresist layer which, together with the masking oxide, patterns the p-type regions. This approach provides a self-alignment of the regions of an element with one another and, in particular, results in a plurality of p-type sub-regions which overlap one another to form the p-type region 26. The excess concentration of acceptors then decreases with increasing distance from the p-n junctions 30 both parallel and perpendicular to the major surface 14. This decrease in the excess concentration in the parallel direction is important to the operation of the array since in conjunction with the proximity of the adjacent elements it reduces the likelihood of breakdown and provides a much more uniform electric field, thereby reducing the extent of the low gain regions between the elements. The p-type region 26 is formed first, preferably by ion implantation of the acceptors into the surface 14 through the openings in the masks, the photoresist layer is stripped and the acceptors are then diffused into the body. The n-type regions 24 are formed preferably by deposition of a glass containing the donors into the openings in the oxide mask, followed by a diffusion of the donors. Preferably the glass is a phosphorus-doped glass (PDG) deposited on the surface 14 from the reaction of silane and phosphine with oxygen at about 350° C. The p-type region 26 typically extends into the body a distance between about 5 and about 50 $\mu$m and typically contain an uncompensated excess concentration of acceptors over that contained in the body 12 of between about 1 and about $3 \times 10^{12}$/cm$^2$ and preferably about $2 \times 10^{12}$/cm$^2$ of surface area through which the acceptors enter the body. The n-type regions 24 typically extend between about 1 and about 8 $\mu$m, and preferably between about 3 and about 5 $\mu$m, into the body and contain an uncompensated concentration of donors between about $10^{14}$ and about $10^{17}$/cm$^2$ of surface area through which the donors enter the body.

The depth of the diffusion of the acceptors is such that neighboring p-type sub-regions overlap in the direction parallel to the surface 14. In a single element APD the n-type region has a greater width along the surface than does the p-type region to reduce the likelihood of breakdown at the edges of the p-n junction. In the APD array of the invention, this is no longer necessary because of the close proximity of the adjacent elements which are at the same potential. The overlapping p-type sub-regions eliminate any n-type channel which may form under the passivation layer, thereby eliminating the need for a channel stop between the elements.

The first electrical contacts 28 and the guard ring electrical contact 40 are composed of about a 50 nanometer (nm) thick chromium layer and about 200 nm thick gold layer sequentially deposited by vacuum evaporation.

The channel stop 44, if required, is composed of a p-type region containing an excess concentration of acceptors and extends a distance of several micrometers or more into the body. This region is formed by deposition of acceptors onto the surface 14 followed by a diffusion step to drive them into the body 12 and is done prior to the fabrication steps describes above.

The contacting region 46 preferably is composed of an excess concentration of boron and extends a distance of about 1 $\mu$m into the body 12. This region is typically formed by simultaneous deposition of boron from a boron nitride wafer and diffusion into the body 12 at a temperature of about 1000° C. for about 0.5 hour. The electrical contact 48 to the contacting region 46 is typically formed by sequential vacuum deposition of chromium and gold.

The anti-reflection coating 50 consists of one or more layers of transparent materials having different indices of refraction and is preferably formed by deposition of a SiO layer having an optical thickness of $\frac{1}{4}$ of the wavelength of light for which the APD array is optimized.

While the APD array has been described as being fabricated by diffusion of the regions into a high resistivity semiconductor body, it is to be understood that other fabrication methods can be used. For example, the array could be fabricated by epitaxial deposition of a $\pi$-type layer on a p$^+$-type body followed by diffusion of the n-type and p-type regions into the $\pi$-type layer.

In the operation of the array 10 a reverse bias voltage is applied to the elements 22 and the guard ring 32 producing a depletion region which reaches through into the portion of the body 12 between the p-type region 26 and 38 and the contacting region 46. The magnitude of the electric field in the p-type region 26 and 38 within a few micrometers of the p-n junctions 30 and 42 respectively is sufficient to produce multiplication of carriers. The overlap of the p-type region 26 and the p-type guard ring region 38 improves the element-to-element gain uniformity since the electric field distribution is the same for the elements at the edge of the array as for those in the center of the array. In addition, since the elements are closely spaced and are at the same potential, each serves as a partial guard ring for the neighboring elements in the array and helps to minimize the width of the regions in which the gain is low.

While the array of the invention has been described as being comprised of regions of particular conductivity types, it is understood that the converse arrangement, where the regions are of opposite conductivity type, is also within the scope of the invention.

The invention is illustrated by the following Example but is not meant to be limited to the details described therein.

EXAMPLE

A linear APD array having 24 elements with a 300 $\mu$m center-to-center spacing and surrounded by a guard ring was fabricated. This array differed from that described above in that the width of the p-type region, perpendicular to the axis of the array, was less than the width of the n-type regions. A body of $\pi$-type conductivity Si having a resistivity of about 3000 $\Omega$-cm and a thickness of about 200 $\mu$m was used. The p-type region was formed by ion implantation and diffusion of boron at 1168° C. for 64 hours producing a region extending between 20 and 25 $\mu$m into the body from the surface. The n-type regions were formed by deposition of PDG into the openings in the oxide mask which are spaced apart by 14 $\mu$m, prediffusing the phosphorus at 1050° C. for 20 minutes, stripping the PDG and the masking oxide, growing the passivation layer, and then heating for 1 hour at 1135° C. to drive the phosphorus in. This sequence of steps produced an array of p-n junctions at a distance between 3 and 4 $\mu$m from the surface of the body with the n-type region containing an excess concentration of phosphorus corresponding to a surface dose of between 3 and $4 \times 10^{15}$/cm$^2$ and a p-type region containing an excess concentration of boron corresponding to a surface dose of about $2 \times 10^{12}$/cm$^2$. The remaining parts of the array were fabricated as described above.

The array was tested by applying a reverse bias voltge of between 200 volts and the breakdown voltage simultaneously to each element and to the guard ring and then scanning each element with a light spot about 25 μm in diameter. For each element the avalanche gain peaked at the center of the element and decreased in the direction along the axis of the array. The region over which the gain was greater than 50 percent of the peak value had a width of between 200 and 225 μm for each element.

We claim:

1. An avalanche photodiode array comprising a body of semiconductor material of a first conductivity type and having two opposed major surfaces;

a plurality of regions of a second conductivity type extending a distance into the body from portions of a first major surface and being spaced apart from one another;

a region of said first conductivity type containing an excess concentration of said first type conductivity modifier, said region comprising sub-regions extending a further distance into the body from each of the regions of said second conductivity type, thereby forming p-n junctions with the regions of said second conductivity type, wherein the concentration of said first type conductivity modifier decreases with increasing distance from the p-n junctions and wherein neighboring sub-regions of said first conductivity type overlap one another;

a contacting region containing an excess concentration of said first type conductivity modifier and extending a distance into the body from a second major surface thereof; and electrical contacts to the regions of said second conductivity type and to said contacting region.

2. The array of claim 1 wherein a guard ring extends into said body from said first major surface about the periphery of said region of first conductivity type; said guard ring comprising a guard ring region of said second conductivity type extending a distance into the body from a portion of the first major surface, a guard ring region of said first conductivity type containing an excess concentration of a first type conductivity modifier extending a further distance into the body from a portion of the guard ring region of said second conductivity type and a guard ring electrical contact overlying the guard ring region of said second conductivity type wherein the guard ring region of said first conductivity type overlaps a portion of the region of said first conductivity type.

3. The array of claim 2 wherein a passivation layer overlies a portion of said first major surface of the body and has a plurality of openings therethrough in those portions of the surface from which the regions of said second conductivity type and the guard ring region of said second conductivity type extend.

4. The array of claim 3 wherein the body is composed of π-type conductivity silicon, the regions of said second conductivity type are n-type conducting, the region of said first type conductivity is p-type conducting and the contacting region is $p^+$-type conducting.

5. The array of claim 4 wherein the region of said first conductivity type contains an excess concentration of acceptors in a total amount corresponding to a dose of between about $1 \times 10^{12}$ and about $3 \times 10^{12}/cm^2$ of the surface area through which the acceptors enter the body.

6. The array of claim 5 wherein the region of said first conductivity type extends a distance between about 5 and 50 μm into said body and wherein the regions of said second conductivity type extend a distance between about 1 and about 8 μm into said body.

7. The array of claim 4 wherein the spacing between the regions of said second conductivity type is less than about 20 μm.

8. The array of claim 4 wherein an anti-reflection coating overlies a portion of the surface from which the contacting region extends into the body.

9. The array of claim 8 wherein a channel stop extends about the periphery of but does not contact the guard ring.

* * * * *